(12) United States Patent
Bora et al.

(10) Patent No.: US 9,098,646 B2
(45) Date of Patent: Aug. 4, 2015

(54) PRINTED CIRCUIT BOARD DESIGN SYSTEM AND METHOD

(75) Inventors: Mumtaz Y. Bora, San Diego, CA (US); Ronald T. Mora, Escondido, CA (US)

(73) Assignee: KYOCERA Corporation, Kyoto (JP)

( * ) Notice: Subject to any disclaimer, the term of this patent is extended or adjusted under 35 U.S.C. 154(b) by 1051 days.

(21) Appl. No.: 11/837,181

(22) Filed: Aug. 10, 2007

(65) Prior Publication Data
US 2010/0270066 A1 Oct. 28, 2010

(51) Int. Cl.
H05K 1/11 (2006.01)
G06F 17/50 (2006.01)
H05K 3/00 (2006.01)
H05K 3/46 (2006.01)

(52) U.S. Cl.
CPC .............. *G06F 17/50* (2013.01); *H05K 3/0005* (2013.01); *H05K 1/115* (2013.01); *H05K 3/4644* (2013.01); *H05K 2201/096* (2013.01); *H05K 2201/09509* (2013.01); *H05K 2201/09518* (2013.01); *H05K 2201/09536* (2013.01)

(58) Field of Classification Search
USPC .......................................... 174/262; 361/792
See application file for complete search history.

(56) References Cited

U.S. PATENT DOCUMENTS

| | | | |
|---|---|---|---|
| 6,192,581 B1 * | 2/2001 | Tsukamoto | 29/852 |
| 6,281,448 B1 * | 8/2001 | Tsukamoto | 174/260 |
| 6,933,450 B2 * | 8/2005 | Okumichi et al. | 174/264 |
| 2002/0017397 A1 * | 2/2002 | Ramey et al. | 174/255 |
| 2005/0098348 A1 * | 5/2005 | Okumichi et al. | 174/262 |
| 2005/0205295 A1 * | 9/2005 | Tsuk | 174/256 |
| 2006/0017529 A1 * | 1/2006 | Cooper et al. | 333/238 |
| 2007/0107934 A1 * | 5/2007 | Mok et al. | 174/262 |

* cited by examiner

Primary Examiner — Andargie M Aychillhum

(57) ABSTRACT

A printed circuit board (PCB) design system and method allows for PCB layouts that can be manufactured using a PCB manufacturing technology selected from multiple PCB manufacturing technologies with minimal or no modification to the PCB layout. In accordance with the exemplary embodiment, the PCB layout is designed to meet all design rules of a High Density Interconnect (HDI) manufacturing technology while minimizing requirements for layout changes when the PCB is manufactured using an Interstitial Via Hole (IVH) manufacturing technology. An IVH PCB includes a plurality of vias positioned within reserved via areas that form connections between at least some conductive elements on the board layers. The conductive elements and the plurality of vias form a layout such that a majority of reserved via areas, of all of the reserved via areas on the printed circuit board, are adequate to accommodate mechanically drilled vias manufactured with the HDI manufacturing technology.

6 Claims, 3 Drawing Sheets

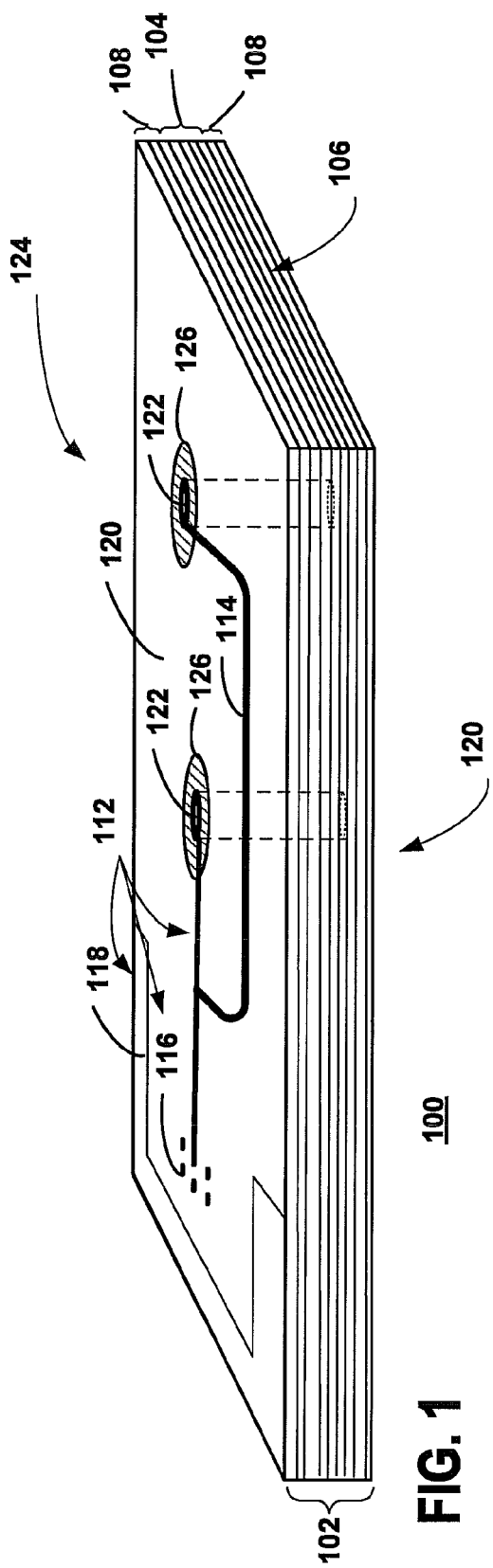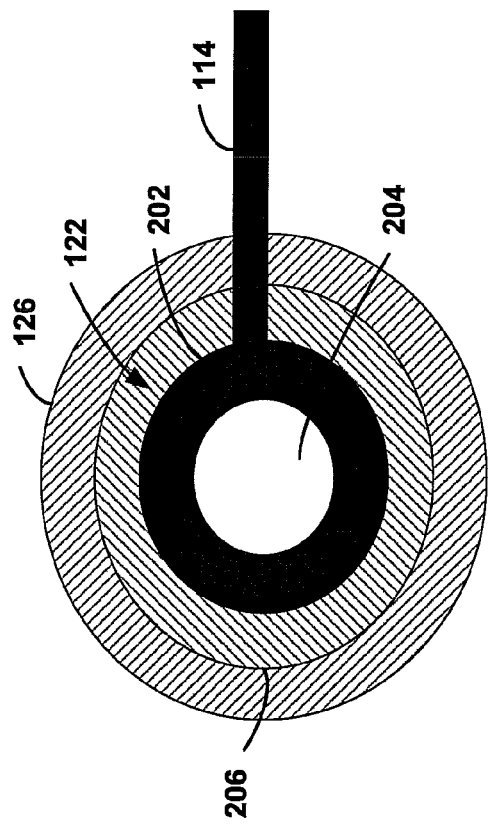

PRINTED CIRCUIT BOARD DESIGN SYSTEM AND METHOD

FIELD

This invention generally relates to wireless communications and more particularly to printed circuit boards (PCBs).

BACKGROUND

There is an increasing demand for functionality and reduced size and weight for portable wireless products, such as handsets, personal digital assistants (PDAs), and personal computer (PC) notebooks. In addition to market demands for small, thin, low-cost and lightweight wireless communication devices, the convergence of wireless telephones and computers is further driving the need for functional circuits designed with the smallest and lowest cost printed circuit board (PCB) manufacturing technology. As a result, the PCBs in these devices increasingly require higher routing densities. High Density Interconnect (HDI) technologies, also known as build up technologies, have been developed to accommodate high density routing. For an HDI PCB, vias can be formed using an non-reinforced dielectric such as a Resin Coated Foil (RCF) or prepreg and using processing techniques such as laser drilling and photo imaging. The vias are typically metalized using electroless copper/electrolytic plating. One advantage of the HDI construction includes the ability to create smaller vias and via pad sizes. This enables higher routing density, lower metal count, reduced board area and increased functionality as compared to traditional PCBs. HDI further improves the wiring density by using build up microvias in the outer layers. Unfortunately, however, the staggered via hole structure results in dead space on certain layers where components cannot be mounted and lines cannot be wire connected. Nevertheless, HDI technologies provide a cost effective and timely means for manufacturing PCBs for wireless devices.

Interstitial via hole manufacturing technologies allow the use of buried and blind vias and do not require mechanically drilled vias since any two layers are electrically connected by a IVH (Interstitial Via Hole). Since the IVH can be placed in any position, no through hole disturbs interconnections between features on other layers. As a result, dead space on the PCB is reduced. The increasing reduction in cost to manufacturing an IVH PCB has further made these technologies attractive for manufacturing PCBs for wireless devices. An example a IVH manufacturing technology is the Any Layer Interstitial Via Hole (ALIVH®). ALIVH® is a registered trademark of Matsushita Electric Industrial Co., Ltd.

Conventional PCB design techniques, however, are limited in that a PCB layout designed for one manufacturing technology must be significantly modified in order to manufacture the PCB in another manufacturing technology. As a result, cost and time savings in using an alternate manufacturing technology is not readily available with conventional PCB layout designs and methods.

Therefore, there is a need for printed circuit boards (PCB) and PCB design systems allowing for manufacturing using multiple PCB manufacturing technologies.

SUMMARY

A printed circuit board (PCB) design system and method allows for PCB layouts that can be manufactured using a PCB manufacturing technology selected from multiple PCB manufacturing technologies with minimal or no modification to the PCB layout. Accordingly, a PCB layout of a PCB meets the requirements, or nearly meets the requirements, for multiple manufacturing technology design rules. In accordance with the exemplary embodiment, the PCB layout is designed to meet all design rules of a High Density Interconnect (HDI) manufacturing technology while minimizing requirements for layout changes when the PCB is manufactured using an Interstitial Via Holes (IVH) manufacturing technology. A PCB manufactured using an IVH fabrication process includes a plurality of vias positioned within reserved via areas and that form connections between at least some conductive elements on the board layers. The conductive elements and the plurality of vias form a layout such that a majority of reserved via areas of all of the reserved via areas on the PCB are adequate to accommodate mechanically drilled vias manufactured in accordance with am HDI manufacturing technology.

BRIEF DESCRIPTION OF THE DRAWINGS

FIG. 1 is a block diagram of a top view of a printed circuit board (PCB) in accordance with an exemplary embodiment of the invention.

FIG. 2 is an illustration of a top view of a via in accordance with the exemplary embodiment.

DETAILED DESCRIPTION

Figure 3:
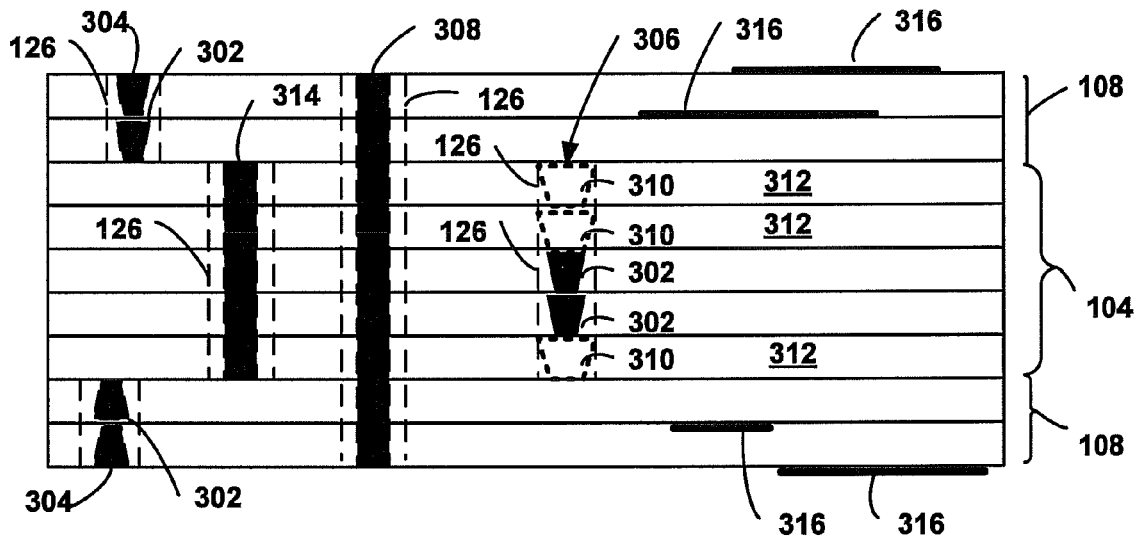
FIG. 3 is a block diagram of a cross sectional view of the PCB where the PCB is manufactured in accordance with the IVH manufacturing technology.

In accordance with the exemplary method discussed below, a merged set of PCB layout design rules are determined based on the requirements of at least a High Density Interconnect (HDI) manufacturing technology and a IVH manufacturing such as the Any Layer Interstitial Via Holes (ALIVH®) manufacturing technology. The merged PCB layout design rules dictate the characteristics of the PCB such as component pad, via, and trace locations and dimensions. A PCB layout is generated that includes a plurality of conductive elements and a plurality of vias connecting at least some of the conductive elements disposed on different layers where the PCB layout meets the design rules for at least a majority of the conductive elements and the vias. The term "PCB layout" refers to the physical arrangement and size of the component pads, vias, ground areas, traces, and layer thicknesses as well as to any description of the arrangement and size captured within any of numerous media. Before the PCB is manufactured, therefore, the PCB layout may be a printed drawing, a drawing stored within electronic memory, a set of associated values stored in memory, or other information stored in memory or accessible through a PCB design program. After the PCB is manufactured, "PCB layout" also refers to the arrangement, size, shape and relative positions of physical components of the PCB such as the traces, component contacts pads, vias, ground areas, board thickness, and layer thicknesses.

In the exemplary embodiment, the PCB layout meets all of the requirements of a primary technology and may meet all of the requirements of an alternate technology. The PCB can be manufactured using the primary technology with no layout adjustments and little or no modification is needed to manufacture the PCB using the alternate technology. For the discussion herein, the primary technology is HDI and the alternate technology is IVH technology such as ALIVH®. For any particular PCB design generated in accordance with the exemplary method, the PCBs manufactured with the different manufacturing technologies will at least be similar and will be identical in some circumstances.

FIG. 1 is a block diagram of a perspective view of a printed circuit board (PCB) 100 in accordance with the exemplary embodiment of the invention. In the interest of brevity and clarity, FIG. 1 illustrates a minimal number of PCB elements and is not necessarily to scale. The PCB 100 includes a plurality of dielectric layers 102 that include a plurality of inner dielectric layers 104 that correspond to core dielectric layers forming a core 106 when the PCB is manufactured using the HDI manufacturing process. A plurality of outer dielectric layers 108 are attached to the core 106 (or inner dielectric layers 104 when the PCB is manufactured using IVH. Conductive elements 112 disposed on the dielectric layers 102 include traces 114, component pads 116 and ground areas 118. The component pads 116 are disposed on one or both of the outermost dielectric layers 120. The traces 114 and ground areas 118 may be positioned on any layer 102. Conductive vias 122 form electrical connections between conductive elements 112 disposed on different layers. The arrangement of conductive elements 102 and vias 122 form a printed circuit board (PCB) layout 124 which may have any of numerous configurations and features. As discussed below in further detail, each via 122 is positioned within a reserved via area 126 where the reserved via area 126 may be the same size or larger than the corresponding via 122. Although other numbers of layers may be used, the PCB 100 includes nine dielectric layers 102 where five inner dielectric layers 104 correspond to core layers that form a core when the PCB layout is manufactured using an HDI process and two outer layers 108 are secured to each side of the group of inner dielectric layers 106. Accordingly, the group of inner dielectric layers 106 is a core when the PCB layout is manufactured using HDI. The overall thickness of the PCB is a multiple of 0.08 mm or 0.10 mm. Therefore, the PCB 100 is either 0.8 mm or 1.0 mm in the exemplary embodiment.

FIG. 2 is an illustration of a top view of a via 122. The via may be positioned on any layer within the PCB 100 and, therefore, FIG. 2 illustrates either a top view or a cross sectional view of the PCB 100 at a via location. Other than a conductive element connected to a particular via, such as a trace 114 (or 118 ground area when the via is connected to ground), no conductive elements are located within the reserved via area 126 of the via 122. Vias 122 includes a via pad 202 and a via hole 204 where a conductive material is disposed along the walls of the via hole 204 to form an electrical connection between features on two or more layers. PCB design constraints require that an area 206 remain clear around the via pad and that no other components, traces, or pads fall within this reserved region. As defined herein, the reserved via area 126 is not necessarily the same as this design dictated via area 206 around the via pad 202. The reserved via area 126 may be the same size or maybe larger than the design vias area 206 around the vias 122 that is kept clear from traces for the particular PCB manufacturing technology and design rules. As discussed herein, therefore, the design via area 206 is a region around a via that is defined by the particular PCB design and manufacturing technology used to make the particular PCB and the reserved via area 126 is a separately defined region around a via 122.

Where the PCB 100 is manufactured in accordance with a IVH PCB manufacturing technology, the PCB layout provides that a majority of reserved via areas of all of the reserved via areas on the PCB 100 are adequate to accommodate vias manufactured in accordance with the HDI manufacturing technology. Since vias are typically laser drilled during the IVH manufacturing process and buried HDI vias 314 are mechanically drilled and are larger than the laser drilled vias, the reserved via areas 126 are sufficiently large to accommodate a mechanically drilled via. Therefore, although the PCB 100 is formed in accordance with the IVH PCB manufacturing technology and includes vias that may be a different size than vias formed with an HDI manufacturing technology, the area (reserved via area 126) around the vias is sufficiently clear of other components, traces, vias, and other elements to allow vias to be formed with the HDI manufacturing technology. Although in the exemplary embodiment all of the reserved via areas 126 are sufficient to accommodate a via formed with the HDI manufacturing technology, in some situations only a majority of the reserved via areas 126 meet the requirement. For example, in some circumstances, one or more vias may be within reserved via areas 126 that are not large enough for an HDI via to be formed. In such circumstances, the PCB layout is modified to meet the HDI requirements if the PCB 100 is manufactured in accordance with the HDI technology.

FIG. 3 is a block diagram of a cross sectional view of the PCB 100 where the PCB 100 is manufactured in accordance with the IVH manufacturing technology. In the interest of brevity and clarity, FIG. 3 illustrates a minimal number of PCB elements and is not necessarily to scale. When the PCB 100 is created using the IVH manufacturing technology, each via 122 is formed with a one or more via sections 302 that are laser drilled in each dielectric layer before the layers are secured to each other. The vias sections may be further processed to create surface vias 304, buried vias 306 and through vias 308 after some or all of the layers are bonded to each other.

As described above, the dielectric layers 102 include inner dielectric layers 104 that correspond to the core dielectric layers 104 of a HDI PCB. In accordance with the exemplary embodiment, every via 302 in an inner dielectric layer 104 has a corresponding reserved via area 310 reserved on all other inner layers 312 at the via location. In some cases, the via 314 is extended through all of the inner layers even though the via 314 does not connect to conductive elements on those other layers. Therefore, at least an open area is reserved on inner dielectric layers 312 (104) above and below a via 302 that is formed in an inner dielectric layer 104. By reserving the vias areas or extending the vias, the PCB 100 can easily be manufactured using the HDI manufacturing technology with minimal or no modification to the PCB layout 124. When the PCB layout 124 is implemented using HDI, the inner dielectric layers 104 are bonded to form a core before the vias within these layers are mechanically drilled. Therefore, if the PCB layout includes traces or other components in an inner layer above or below a via in an inner dielectric layer, the PCB 100 could not be formed using HDI unless the PCB layout 124 is modified to move the traces or other components to provide adequate space to form a via.

In the exemplary embodiment, the reserved via areas 310 have the same size as the reserved via areas 126 formed around a via on the same layer. A reserved via area 126 surrounds a buried via 306 on the same inner dielectric layer 104 and reserved via areas 310 are positioned above and below the via 306 on the other inner dielectric layers where the reserved via areas 126, 310 have the same size. The size and shape of the reserved via areas 126, 310 are selected to allow a via to be formed using the HDI manufacturing technology.

In addition to the vias 122, the PCB 100 elements may have other characteristics dictated by the merged design rules to facilitate manufacturing of the PCB 100 by multiple manufacturing technologies. For example, conductive traces 316 that are required to exhibit a particular impedance may be limited to a particular layer or layers. In the exemplary embodiment, these critical impedance traces 316 are limited to the outer layers 108. Accordingly, the critical impedance traces 316 are disposed on the outer most layers 120 or on the conductive layer directly below the first dielectric layer. By restricting the critical impedance layers to the outer layers, manufacturing in a critical impedance trace using the IVH technology requires little or no modification of the PCB layout. The core layers 104 are typically thicker than the outer layers 108 in an HDI PCB and the outer layers 108 are more consistent with the thickness of layers used with an IVH manufacturing technology. Accordingly, traces implemented on the outer layers 108 in and HDI PCB will have the same impedance when the PCB is implemented in accordance with the IVH manufacturing technology.

Figure 4:
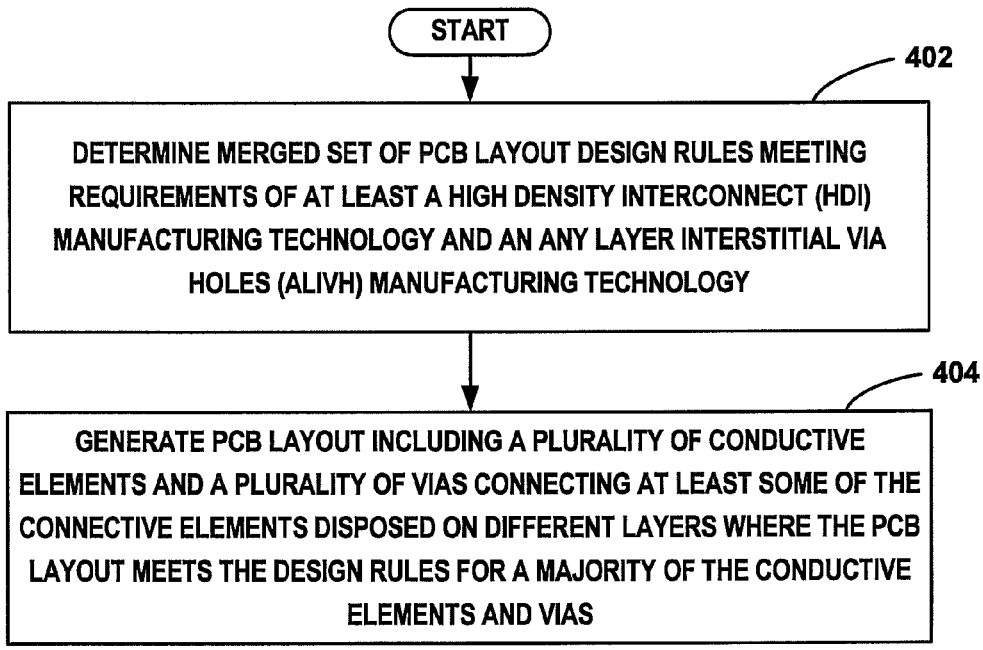
FIG. 4 is a flow chart of a method of manufacturing a PCB in accordance with the exemplary embodiment.

FIG. 4 is a flow chart of a method of manufacturing a PCB 100 in accordance with the exemplary embodiment. The method may be performed using a computer aided design (CAD) PCB design software application.

At step 402, a merged set of PCB layout design rules meeting requirements of at least a High Density Interconnect (HDI) manufacturing technology and an Interstitial Via Holes (IVH) manufacturing technology are determined. The most restrictive rule of the two technologies is established as the merged PCB layout rule. A rule is determined to be more restrictive if it places an additional burden on locations and sizes of other PCB elements. For example, a rule requiring a larger via hole is determined to be more restrictive since more area is required and places additional constraints on the location and size of other PCB elements than a smaller via hole.

At step 404, a PCB layout 124 is generated that includes a plurality of conductive elements and a plurality of vias 122 connecting at least some of the connective elements disposed on different layers where the PCB layout meets the design rules for a majority of the conductive elements and vias. Although every conductive element and via may meet the requirements of both manufacturing technologies, in some circumstances, a few PCB features may only meet one technology requirements. In these circumstances, the PCB layout 124 is modified when the PCB 100 is manufactured using the other manufacturing technology.

Figure 5:
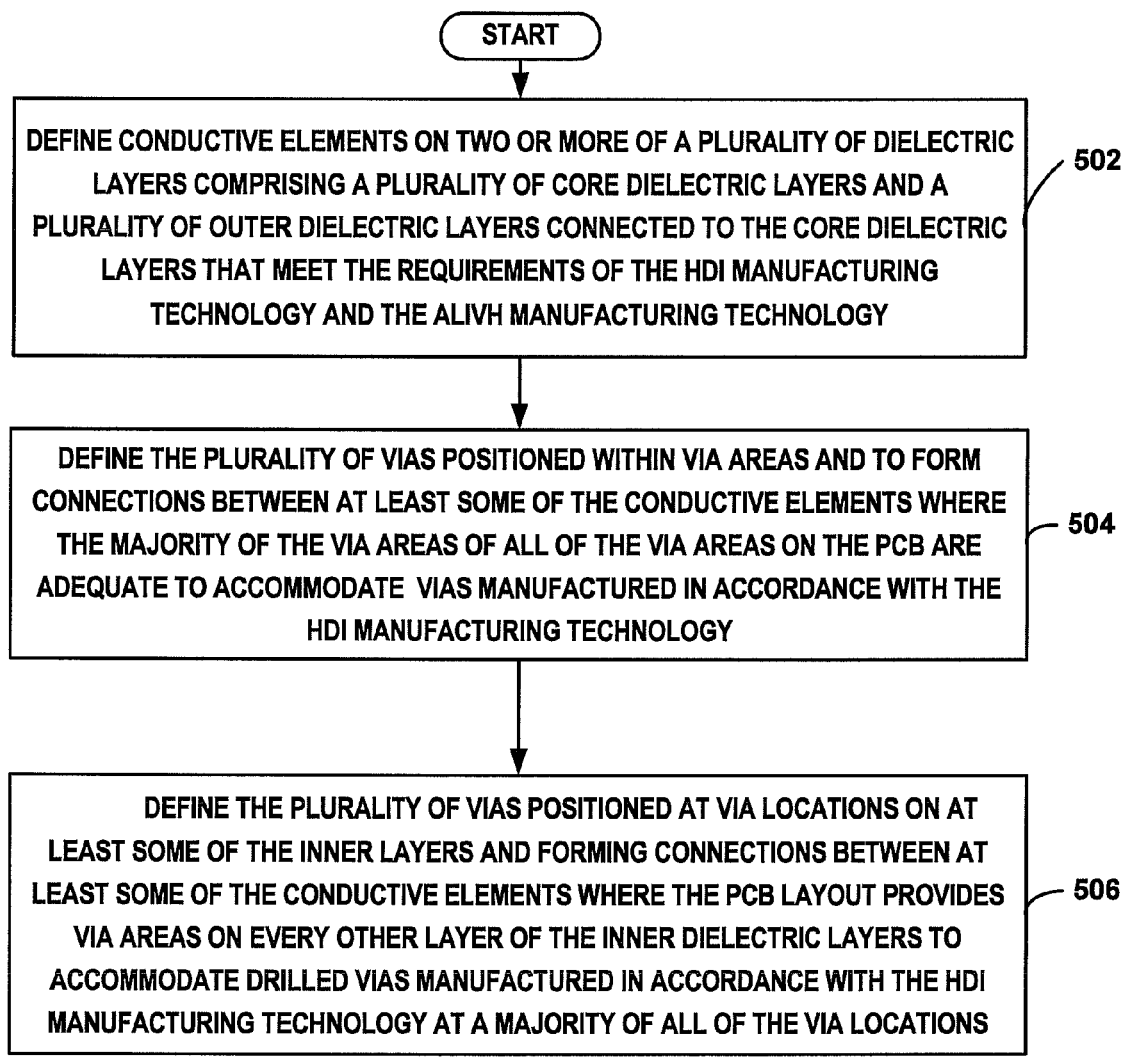
FIG. 5 is a flow chart of the exemplary method of manufacturing a PCB where the merged design rules include rules related to vias.

FIG. 5 is a flow chart of the exemplary method of manufacturing a PCB 100 where the merged design rules include rules related to vias. Accordingly, steps 502-506 provide an example of performing steps 402 and 404 discussed with reference to FIG. 4 above.

At step 502, conductive elements are defined on two or more of a plurality of dielectric layers 102 which comprise a plurality of core dielectric layers (inner dielectric layers) 104 and a plurality of outer dielectric layers 108 connected to the core dielectric layers 104 that meet the requirements of the HDI manufacturing technology and the IVH manufacturing technology.

At step 504, the plurality of vias positioned within reserved via areas are defined to form connections between at least some of the conductive elements where the majority of the reserved via areas of all of the reserved via areas on the PCB are adequate to accommodate mechanically drilled vias manufactured in accordance with the HDI manufacturing technology.

At step 506, the plurality of vias that are positioned at via locations on at least some of the inner layers are defined to form connections between at least some of the conductive elements where the PCB layout provides reserved via areas on every other layer of the inner dielectric layers to accommodate drilled vias manufactured in accordance with HDI manufacturing technology at a majority of all of the via locations.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. A printed circuit board comprising:
    a plurality of dielectric layers comprising a plurality of inner dielectric layers positioned between a plurality of outer dielectric layers;
    a via positioned within a first reserved via area within at least one of the inner dielectric layers, wherein the first reserved via area meets all pertinent design rules of both a first manufacturing technology and a second manufacturing technology; and
    a second reserved via area, through which the via does not extend, formed at a via location of the via and within at least one inner dielectric layer above or below the inner dielectric layer in which the via is located, wherein the second reserved via area meets all pertinent design rules of the second manufacturing technology.

2. The printed circuit board of claim 1, wherein the first manufacturing technology is an Interstitial Via Hole (IVH) manufacturing technology and the second manufacturing technology is a High Density Interconnect (HDI) manufacturing technology.

3. The printed circuit board of claim 1, wherein the second reserved via area comprises one or more reserved via areas, wherein one of the one or more reserved via areas is disposed within every inner dielectric layer in which the via is not located, each of the one or more reserved via areas located at the via location.

4. The printed circuit board of claim 3, wherein the second reserved via area is clear of traces and other components.

5. The printed circuit board of claim 1, wherein the second reserved via area has a size that is substantially the same as a size of the first reserved via area.

6. The printed circuit board of claim 1, wherein the second reserved via area has a shape that is substantially the same as a shape of the first reserved via area.

* * * * *